United States Patent
Su

(12) 
(10) Patent No.: US 7,647,566 B2
(45) Date of Patent: Jan. 12, 2010

(54) METHOD FOR CREATING NEW VIA

(75) Inventor: Shih-Yi Su, Sinshih Township, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 407 days.

(21) Appl. No.: 11/649,220

(22) Filed: Jan. 4, 2007

(65) Prior Publication Data

US 2007/0162883 A1     Jul. 12, 2007

(30) Foreign Application Priority Data

Jan. 9, 2006     (TW) .............................. 95100811 A

(51) Int. Cl.
*G06F 17/50*     (2006.01)
(52) U.S. Cl. ...................... 716/1; 716/5; 716/9; 716/11
(58) Field of Classification Search ...................... 716/1, 716/5, 9–13
See application file for complete search history.

(56) References Cited

U.S. PATENT DOCUMENTS

| | | | |
|---|---|---|---|
| 5,574,853 A | 11/1996 | Barch et al. | |
| 5,798,937 A * | 8/1998 | Bracha et al. | ................... 716/9 |
| 6,941,535 B2 | 9/2005 | Sekido et al. | |
| 2003/0188271 A1 | 10/2003 | Zhuang et al. | |
| 2003/0229866 A1* | 12/2003 | Allen et al. | ..................... 716/5 |
| 2005/0188339 A1 | 8/2005 | Anderson | |

FOREIGN PATENT DOCUMENTS

JP     2004-258869     9/2004

* cited by examiner

*Primary Examiner*—Paul Dinh
(74) *Attorney, Agent, or Firm*—Rabin & Berdo, P.C.

(57) ABSTRACT

A method for creating new vias in an integrated circuit chip. The method automatically creates a plurality of new vias around an original via for electrically connecting two metal layers to each other in circuit layout data of the integrated circuit chip. The new vias also electrically connect the two metal layers to each other. According to the new vias, the probability of certainly electrically connecting the two metal layers of the integrated circuit chip to each other can be increased when the integrated circuit chip is being manufactured.

3 Claims, 4 Drawing Sheets

METHOD FOR CREATING NEW VIA

This application claims the benefit of Taiwan application Serial No. 95100811, filed Jan. 9, 2006, the subject matter of which is incorporated herein by reference.

BACKGROUND OF THE INVENTION

1. Field of the Invention

The invention relates in general to an integrated circuit chip, and more particularly to a method for creating new vias (electric contacts) in the integrated circuit chip.

2. Description of the Related Art

FIG. 1 (Prior Art) is a schematic illustration showing a partial circuit layout of an integrated circuit chip 100. As shown in FIG. 1, the circuit layout of the integrated circuit chip 100 has a first metal layer M1 and a second metal layer M2 adjacent to each other. A wire 102 of the first metal layer M1 is electrically connected to a wire 104 of the second metal layer M2 through a via (electric contact). Ideally, when the integrated circuit chip 100 is being manufactured, the via can certainly electrically connect the first metal layer to the second metal layer. However, the via sometimes cannot certainly electrically connect the wire 102 to the wire 104 during the actual manufacturing process due to the following factors. For example, particles may be filled into the via or the conductive layer of the via is poorly formed. Thus, the two metal layers M1 and M2 are not certainly electrically connected to each other. Consequently, the signals in the integrated circuit chip 100 cannot be normally transmitted to the wires 102 and 104, thereby disabling the integrated circuit chip 100 from working normally.

Thus, how to provide a quick and effective method to solve the above-mentioned problems is an important subject in the IC industry.

SUMMARY OF THE INVENTION

It is therefore an object of the invention to provide a method for creating new vias in an integrated circuit chip. According to the new vias, the probability of certainly electrically connecting two metal layers to each other in the integrated circuit chip can be greatly increased when the integrated circuit chip is being manufactured.

The invention achieves the above-identified object by providing a method for creating a new via being executed in a computer system. The method includes the following steps. First, circuit layout data of an integrated circuit chip is obtained. Next, a first via for electrically connecting two metal layers to each other is found. Then, a new second via adjacent to the first via is created in the circuit layout data. The second via electrically connects the two metal layers to each other. The method may further include the steps of: judging whether the second via changes an original circuit connection relationship of the integrated circuit chip; keeping the second via in the circuit layout data if the second via changes the original circuit connection relationship; and deleting the second via from the circuit layout data if the second via does not change the original circuit connection relationship.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides a method for creating new vias in an integrated circuit chip. The method is executed in a computer system. In this invention, a plurality of new vias around an original via is automatically created to electrically connect two metal layers, such as two metal wires, to each other in circuit layout data of the integrated circuit chip. The new vias also electrically connect the two metal layers to each other. According to these new vias, the probability of certainly electrically connecting the two metal wires to each other in the integrated circuit chip can be greatly increased when the integrated circuit chip is being manufactured.

Figure 1:
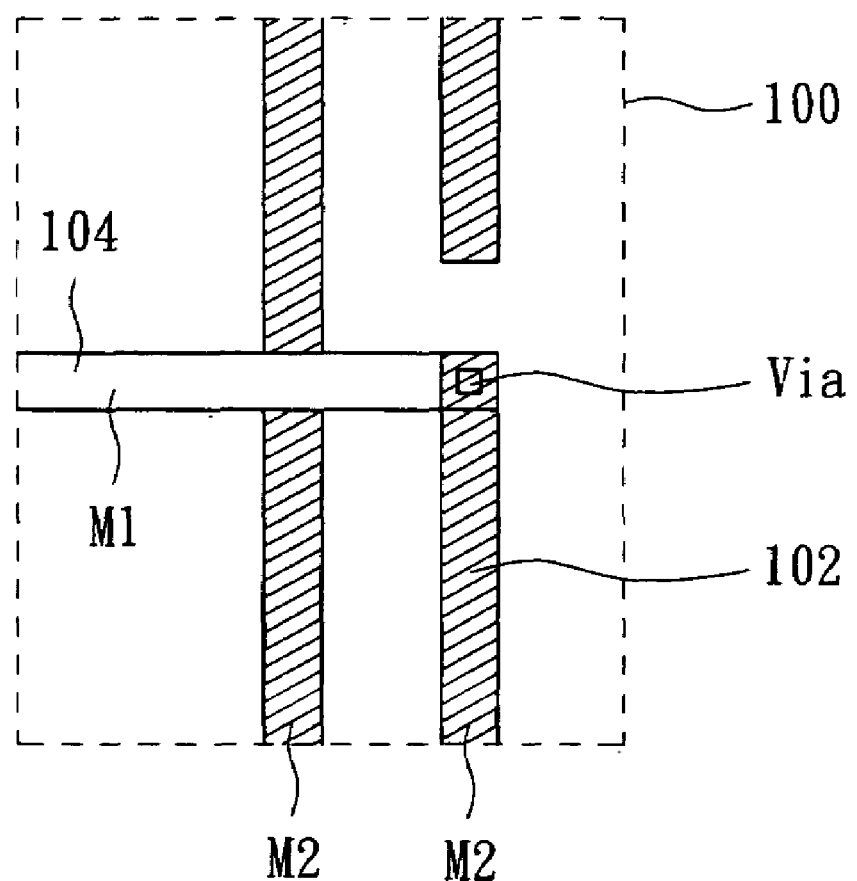
FIG. 1 (Prior Art) is a schematic illustration showing a partial circuit layout of an integrated circuit chip.
Figure 2:
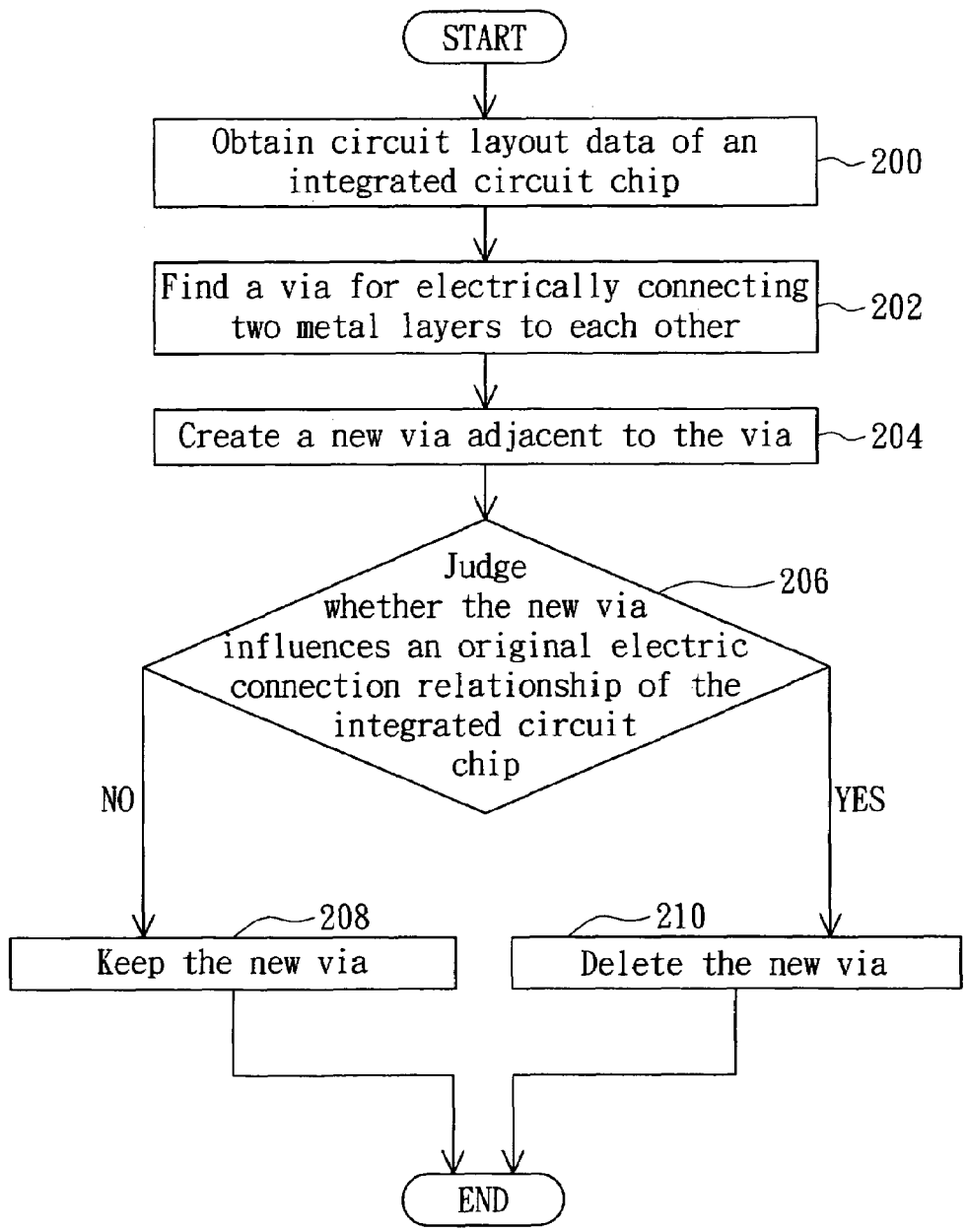
FIG. 2 is a flow chart showing a method for creating new vias.
Figure 3A:
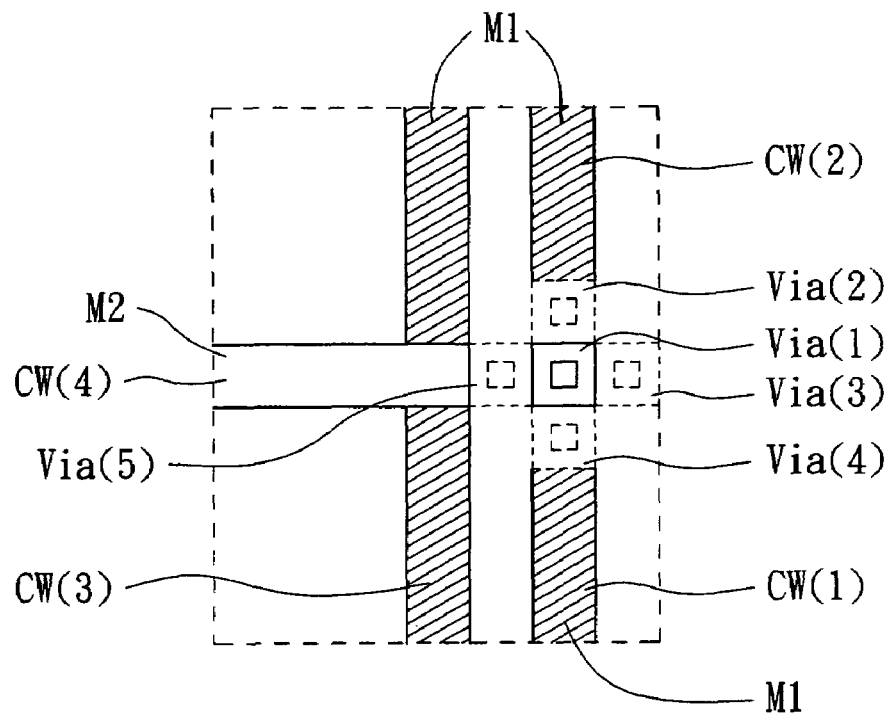
FIG. 3A is a schematic illustration showing a partial circuit layout of the integrated circuit chip.
Figure 3B:
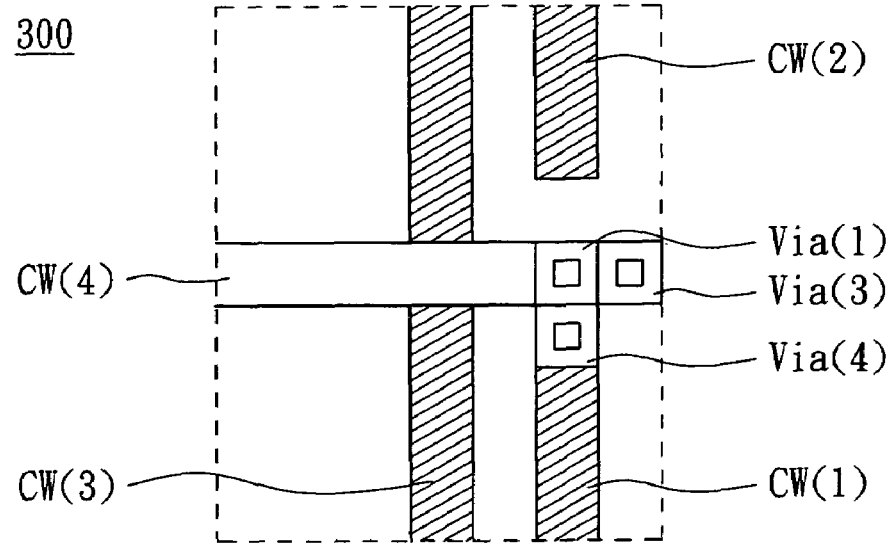
FIG. 3B is a schematic illustration showing a partial circuit layout of the integrated circuit chip after new vias are created.

FIG. 2 is a flow chart showing a method for creating new vias. As shown in FIG. 2, the method is used in the integrated circuit chip. First, in step 200, the circuit layout data of the integrated circuit chip 300 is obtained. The integrated circuit chip 300 is shown in FIGS. 3A and 3B. Next, in step 202, a via for electrically connecting two metal layers to each other is found from the circuit layout data. In step 204, a new via adjacent to the via found in step 202 is created. The new via electrically connects the two metal layers to each other. Step 206 judges whether the new via influences the original electric connection relationship of the integrated circuit chip 300. Next, if the judgement result of step 206 is "no", step 208 is performed. In step 208, the new via is kept. If the judgement result of the step 206 is "yes", step 210 is performed. In step 210, the new via is deleted.

FIG. 3A is a schematic illustration showing a partial circuit layout of the integrated circuit chip. The integrated circuit chip 300 comprises a first wire CW(1), a second wire CW(2) and a third wire CW(3) formed by the first metal layer M1, and a fourth wire CW(4) formed by the second metal layer M2. The first via(1) is originally designed to electrically connect the first wire CW(1) to the fourth wire CW(4). In practice, the integrated circuit chip 300 may have multiple metal layers and multiple vias for electrically connecting the adjacent metal layers to each other. However, this embodiment is illustrated by taking the first via(1) and the two metal layers M1 and M2 of FIG. 3A as an example. First, step 200 obtains the circuit layout data of the integrated circuit chip 300. For example, a computer system reads a recording medium for recording a program code, which records the method for creating the new vias. The computer system (not shown) reads the circuit layout data of the integrated circuit chip 300 in step 200. Next, in step 202, the computer system finds the first via(1) of FIG. 3A from the circuit layout data. Next, in step 204, the computer system automatically creates a new via at one side of the first via(1). For example, as shown in FIG. 3A, a second via(2) is created at the top side of the first via(1). The second via(2) also electrically connects the first wire CW(1) of the first metal layer M1 to the fourth wire CW(4) of the second metal layer M2.

Thereafter, in step 206, the computer system automatically judges whether the second via(2) influences the original electric connection relationship of the integrated circuit chip 300. As shown in FIG. 3A, the new second via(2) causes the first metal layer M1 to extend upward, and the upward extending portion of the first metal layer M1 electrically connects the first wire CW(1) of the first metal layer M1 to the second wire CW(2) of the first metal layer M1. Thus, the first wire CW(1) and the second wire CW(2), which are originally electrically disconnected from each other, are electrically connected to each other. So, the judgement result of step 206 is "yes", which means that the new second via(2) influences the original electric connection relationship of the integrated circuit chip 300. Thus, in step 210, the computer system automatically deletes the second via(2). Thereafter, the computer system repeats steps 204 to 210 until four new vias at the circumference (e.g., up, down, left and right sides) of the first via(1) are created. The four vias are respectively the second via(2), the third via(3), the fourth via(4) and the fifth via(5). As shown in FIG. 3A, the new third via(3) is disposed at the right side of the first via(1). The new fourth via(4) is disposed at the down side of the first via(1). The new fifth via(5) is disposed at the left side of the first via(1). The computer system respectively judges whether each of the via(2) to via(5) influences the original electric connection relationship of the integrated circuit chip 300 so as to determine which via has to be kept. As for the fifth via(5), the leftward extending portion of the first metal layer M1 caused by the fifth via(5) electrically connects the first wire CW(1) of the first metal layer M1 to the third wire CW(3) of the first metal layer M1. So, the fifth via(5) and the second via(2) influence the original electric connection relationship of the integrated circuit chip 300. Finally, the via corresponding to the judgement result of "no" in step 206 is kept, while the via corresponding to the judgement result of "yes" in step 206 is automatically deleted. That is, the only two new via(3) and via(4) are left around the first via(1).

FIG. 3B is a schematic illustration showing a partial circuit layout of the integrated circuit chip after new vias are created. Finally, as shown in FIG. 3B, only the third via(3) and the fourth via(4) are left around the first via(1). Consequently, when the integrated circuit chip 300 is manufactured, the third via(3) or the fourth via(4) can certainly electrically connect the first wire CW(1) to the fourth wire CW(2) so that signals can be correctly transferred even if the first via(1) fails to certainly electrically connect the first wire CW(1) of the first metal layer M1 to the fourth wire CW(2) of the second metal layer M2 due to some reasons. Thus, according to these new vias, the probability of certainly electrically connecting the two metal wires CW(1) and CW(4) to each other in the integrated circuit chip 300 can be greatly increased when the integrated circuit chip 300 is being manufactured.

It is to be noted that although the embodiment creates a new via at one side of the original via, the new via may also be created at a corner position of the original via.

In summary, the yield of the manufactured integrated circuit chip can be greatly increased by judging whether the new vias can be created around each original via in the integrated circuit chip. In addition, the inconvenient problem and the time-consuming problem caused in the method of manually creating the new vias may also be solved. That is, it is unnecessary to manually perform the operations of creating the new vias and judging whether the new vias influence the original circuit connection relationship of the integrated circuit chip in the above-mentioned computer system.

In addition, the method of the flow chart of FIG. 2 may be executed as follows. One new via is created around the original via in the original circuit design, and then it is judged whether the new via influences the electric connection relationship of the integrated circuit chip 300. However, it is also possible to create four new vias around the original via in the original circuit design, and then judge whether the four new vias influence the original electric connection relationship of the integrated circuit chip 300.

Figure 4:
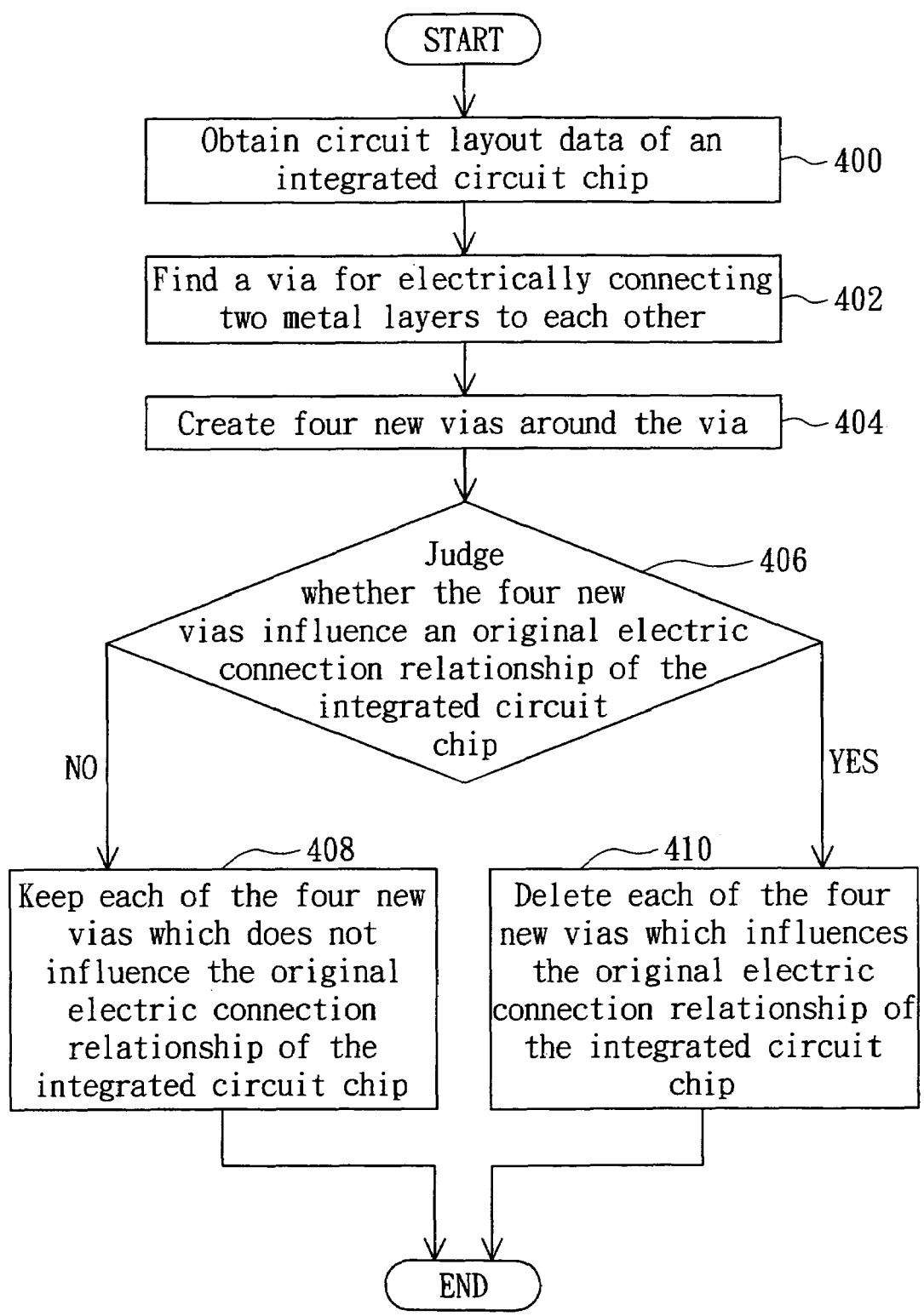
FIG. 4 is a flow chart showing another method for creating new vias according to the invention.

FIG. 4 is a flow chart showing another method for creating new vias according to the invention. First, in step 400, the circuit layout data of the integrated circuit chip 300 is obtained. Then, in step 402, a via, such as the first via(1), for electrically connecting two metal layers to each other is found from the circuit layout data. In step 404, four new vias, such as the second via(2), the third via(3), the fourth via(4) and the fifth via(5), are created around the via found in step 402. Step 406 judges whether the four vias influence the original electric connection relationship of the integrated circuit chip 300. Next, step 408 is performed to the new via if the judgement result of step 406 is "no". Step 408 keeps the new vias, such as the third via(3) and the fourth via(4), which do not influence the original electric connection relationship of the integrated circuit chip 300. Otherwise, step 410 is performed to the new via if the judgement result of step 406 is "yes". In step 410, the new vias, such as the second via(2) and the fifth via(5), which influence the original electric connection relationship of the integrated circuit chip 300, are deleted.

In detail, for example, the computer system reads another recording medium for recording the program code of the method for creating the new vias in FIG. 4. The computer system reads the circuit layout data of the integrated circuit chip 300 and then finds a certain via, such as the first via(1). The computer system automatically creates four new vias, such as the second via(2), the third via(3), the fourth via(4) and the fifth via(5), at the circumference (e.g., up, down, left and right sides) of the first via(1). Then, the computer system automatically judges the via(2) to via(5) to keep the new via, which does not influence the original electric connection relationship of the integrated circuit chip 300. After the computer system has judged the number of new vias, which may be created around the first via(1), the computer system finds another first via and judges whether the new vias can be created around the another first via until all of the original vias in the integrated circuit chip 300 have encountered the above-mentioned steps.

It is to be noted that although the embodiment creates four new vias at four sides of the original via(1), the new vias may also be created at corner positions of the original via.

It is to be noted that the type of the computer system mentioned in this embodiment is not particularly restricted. The computer system may be a typical desktop computer system, a notebook computer system or a barebone system. In addition, the kind of the recording medium is not particularly restricted. The recording medium may be a memory, a hard disk drive or an optical disc.

The method for creating the new vias in the integrated circuit chip may further be implemented through a computer system for executing a program code, which records the method of creating new vias in the integrated circuit chip. This program code is recorded in the recording medium. The computer system may further include means for executing each step in the method for creating new vias to implement the invention.

Thus, the invention provides the method for creating new vias in the integrated circuit chip. According to these new vias, the probability of certainly electrically connecting the two metal wires to each other in the integrated circuit chip can be greatly increased when the integrated circuit chip is being manufactured. Also, the problem of the inconvenience and the time-consuming problem encountered in the method of manually creating new vias can be solved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for designing an integrated circuit chip being executed in a computer system, the method comprising the steps of:
    obtaining circuit layout data of the integrated circuit chip by the computer system;
    finding a first via for electrically connecting two metal layers to each other by the computer system;
    creating a new second via adjacent to the first via in the circuit layout data, the second via electrically connecting the two metal layers to each other;
    creating a third via, a fourth via, and a fifth via, which are adjacent to the first via, in the circuit layout data, wherein the second via faces the fourth via, and the third via faces the fifth via;
    judging whether each of the second to fifth vias changes an original circuit connection relationship of the integrated circuit chip by the computer system;
    keeping each of the second to fifth vias, which does not change the original circuit connection relationship, in the circuit layout data at the computer system; and
    deleting each of the second to fifth vias, which changes the original circuit connection relationship, from the circuit layout data by the computer system.

2. A recording medium containing a program code for executing a method for designing an integrated circuit chip in a computer system, the method comprising the steps of:
    obtaining circuit layout data of the integrated circuit chip;
    finding a first via for electrically connecting two metal layers to each other;
    creating a new second via adjacent to the first via in the circuit layout data, the second via electrically connecting to the two metal layers to each other;
    creating a third via, a fourth via, and a fifth via, which are adjacent to the first via, in the circuit layout data, wherein the second via faces the fourth via, and the third via faces the fifth via;
    judging whether each of the second to fifth vias changes an original circuit connection relationship of the integrated circuit chip;
    keeping each of the second to fifth vias, which does not change the original circuit connection relationship, in the circuit layout data; and
    deleting each of the second to fifth vias, which changes the original circuit connection relationship, from the circuit layout data.

3. A computer system, comprising:
    means for obtaining circuit layout data of an integrated circuit chip;
    means for finding a first via for electrically connecting two metal layers to each other;
    means for creating a new second via adjacent to the first via in the circuit layout data, wherein the second via electrically connects the two metal layers to each other;
    creating a third via, a fourth via, and a fifth via, which are adjacent to the first via, in the circuit layout data, wherein the second via faces the fourth via, and the third via faces the fifth via;
    means for judging whether each of the second to fifth vias changes an original circuit connection relationship of the integrated circuit chip;
    means for keeping each of the second to fifth vias, which does not change the original circuit connection relationship, in the circuit layout data; and
    means for deleting each of the second to fifth vias, which changes the original circuit connection relationship, from the circuit layout data.

* * * * *

UNITED STATES PATENT AND TRADEMARK OFFICE
CERTIFICATE OF CORRECTION

| | | |
|---|---|---|
| PATENT NO. | : 7,647,566 B2 | Page 1 of 1 |
| APPLICATION NO. | : 11/649220 | |
| DATED | : January 12, 2010 | |
| INVENTOR(S) | : Shih-Yi Su | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 415 days.

Signed and Sealed this

Sixteenth Day of November, 2010

David J. Kappos
*Director of the United States Patent and Trademark Office*